United States Patent
Won

(12) United States Patent (10) Patent No.: US 7,260,017 B2
Won (45) Date of Patent: Aug. 21, 2007

(54) NON-VOLATILE MEMORY DEVICE HAVING BUFFER MEMORY WITH IMPROVE READ SPEED

(75) Inventor: Sam Kyu Won, Icheon-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 81 days.

(21) Appl. No.: 11/306,069

(22) Filed: Dec. 15, 2005

(65) Prior Publication Data

US 2006/0209605 A1 Sep. 21, 2006

(30) Foreign Application Priority Data

Mar. 15, 2005 (KR) .................. 10-2005-0021480

(51) Int. Cl.
G11C 8/00 (2006.01)
(52) U.S. Cl. ........................ 365/230.04; 365/230.08
(58) Field of Classification Search ........... 365/230.04, 365/230.08, 185.12, 185.17
See application file for complete search history.

(56) References Cited

U.S. PATENT DOCUMENTS

| 6,426,893 | B1 | 7/2002 | Conley et al. | |
|---|---|---|---|---|
| 6,704,239 | B2* | 3/2004 | Cho et al. | 365/230.04 |
| 6,996,014 | B2* | 2/2006 | Lee et al. | 365/189.05 |
| 2003/0021172 | A1* | 1/2003 | Cho et al. | 365/203 |
| 2005/0226046 | A1* | 10/2005 | Lee et al. | 365/185.12 |

FOREIGN PATENT DOCUMENTS

| JP | 2002-319291 A | 10/2002 |
|---|---|---|
| JP | 2004-265483 A | 9/2004 |
| KR | 1998-0021002 A | 6/1998 |
| KR | 2002-0057355 A | 7/2002 |
| KR | 2005-0059984 A | 6/2005 |

* cited by examiner

Primary Examiner—Vu A. Le
(74) Attorney, Agent, or Firm—Marshall, Gerstein & Borun LLP

(57) ABSTRACT

Non-volatile memory devices may include a buffer memory corresponding to one block of a memory cell array, thus improving a read operation. The non-volatile memory device may include a memory cell array including a plurality of memory blocks, each having memory cells disposed at the intersections of bit lines and word lines, a plurality of page buffers connected to the bit lines through a sensing line, and a buffer memory connected between the plurality of memory blocks and the plurality of page buffers. The buffer memory may include special buffers for storing the same data as those of the memory cells.

10 Claims, 3 Drawing Sheets

FIG. 3

| SBM | Line name | Erase (Volt) | Program(Volt) | Read(Volt) |
|---|---|---|---|---|
| Enable | WL(Vpgm) | 0 | 18V | 0 |
| | WL(Vpass) | 0 | 9.5V | 0 |
| | DSL | Floating | Vcc | 0 |
| | SSL | Floating | 0 | 0 |
| | CSL | Floating | Vcc | 0 |
| | TPWELL | 20V | 0 | 0 |
| | BL(Select) | Floating | 0 | 1(ERASE) 0(PROGRAM) |
| | BL(Non-select) | Floating | Vcc | 1(ERASE) 0(PROGRAM) |
| | SWL(Select) | 0 | Vcc+Vth | Vcc+Vth |
| | SWL(Non-select) | 0 | 0 | 0 |
| | SBMRST | Vcc | 0 | 0 |
| Disable | WL(Vpgm) | 0 | 18V | 0 |
| | WL(Vpass) | 0 | 9.5V | 4.5V |
| | DSL | Floating | Vcc | 4.5V |
| | SSL | Floating | 0 | 4.5V |
| | CSL | Floating | Vcc | 0 |
| | TPWELL | 20V | 0 | 0 |
| | BL(Select) | Floating | 0 | 0(ERASE) 1(PROGRAM) |
| | BL(Non-select) | Floating | Vcc | 0(ERASE) 1(PROGRAM) |
| | SWL(Select) | 0 | 0 | 0 |
| | SWL(Non-select) | 0 | 0 | 0 |
| | SBMRST | 0 | 0 | 0 |

NON-VOLATILE MEMORY DEVICE HAVING BUFFER MEMORY WITH IMPROVE READ SPEED

TECHNICAL FIELD

This patent relates to non-volatile memory devices, and more specifically, to NAND flash memory devices having a buffer memory with an improved read operation.

DISCUSSION OF RELATED ART

There is an increasing need for non-volatile memory devices which can be electrically programmed and erased and do not need a refresh function of rewriting data at a constant cycle. The term "program" refers to an operation of writing data into memory cells.

For higher integration of memory devices, a NAND flash memory device in which a plurality of memory cells is connected in series (i.e., a structure in which neighboring cells share the drain or source) to form one string has been developed. The NAND flash memory device is a memory device that sequentially reads information unlike a NOR flash memory device.

The NAND flash memory device employs a page buffer in order to store a large capacity of information or read stored information with a short period of time. The page buffer functions to receive a large capacity of data from an I/O pad and provide the data to memory cells, or store data of the memory cells therein and then output the data. The page buffer is generally constructed of a single register in order to temporarily store data. Recently, however, the page buffer adopts a dual register in order to increase the program speed while programming a large capacity of data in the NAND flash memory device.

A time necessary for a read operation in the NAND flash memory device is slower than that of other memories. To overcome this problem, data are programmed or read on a page (cells connected to one word line) basis. However, although data are programmed or read on a page basis, lots of time is taken in order to read data into a page buffer from a cell.

SUMMARY OF THE INVENTION

NAND flash memory devices may include a buffer memory corresponding to one block of a memory cell array, thus improving a read operation.

A non-volatile memory device may include a memory cell array including a plurality of memory blocks, each having memory cells disposed at the intersections of bit lines and word lines, a plurality of page buffers connected to the bit lines through a sensing line, and a buffer memory connected between the plurality of memory blocks and the plurality of page buffers. The buffer memory includes special buffers for storing the same data as those of the memory cells.

BRIEF DESCRIPTION OF THE DRAWINGS

FIG. 3 is a table showing a bias condition of the NAND flash memory device shown in FIG. 2.

DETAILED DESCRIPTION

Now, the various embodiments will be described with reference to the accompanying drawings. Since preferred embodiments are provided for the purpose that the ordinary skilled in the art are able to understand the present disclosure, they may be modified in various manners and the scope of the present invention is not limited by the described embodiments.

Figure 1:
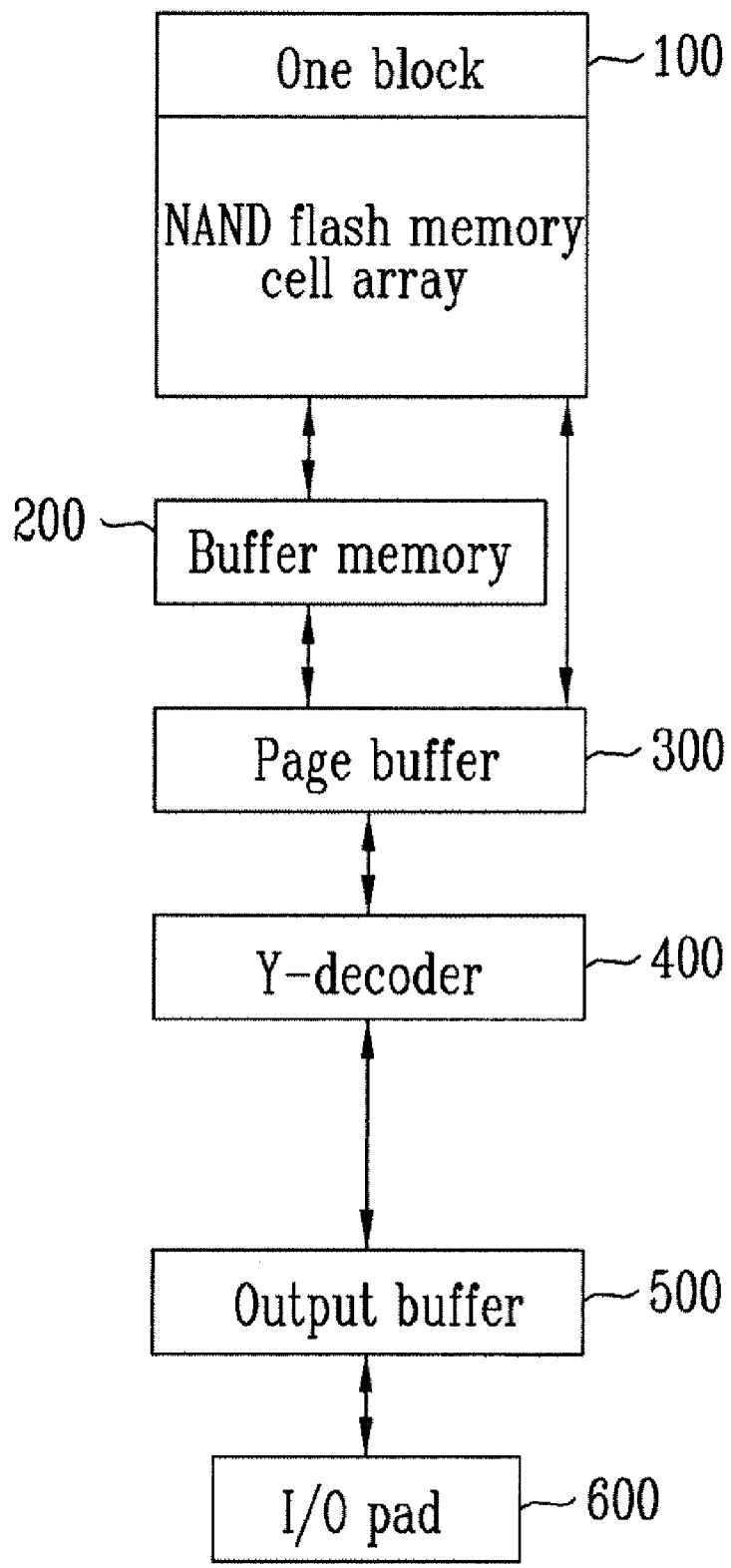
FIG. 1 is a block diagram of a NAND flash memory device.
Figure 2:
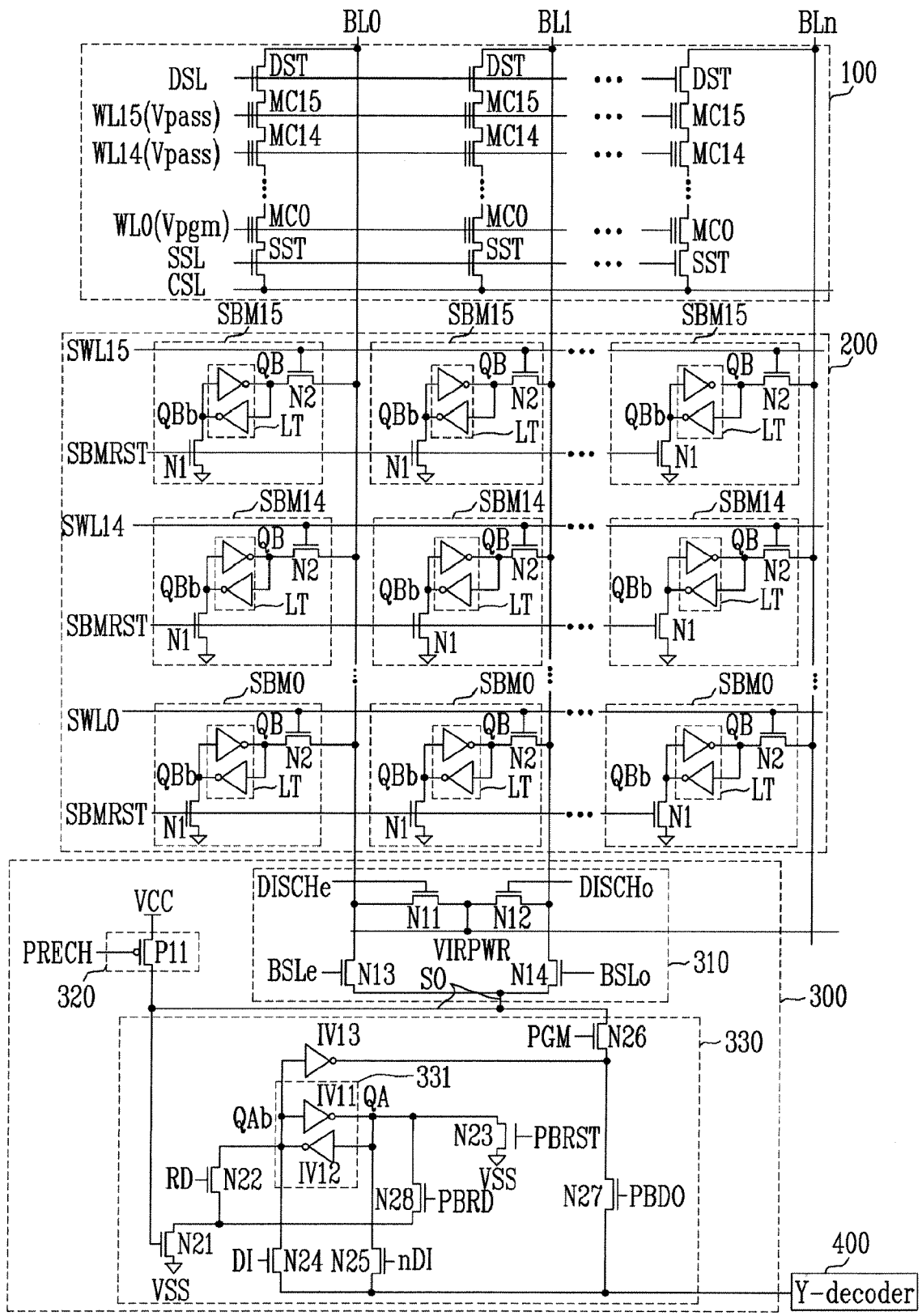
FIG. 2 is a detailed circuit diagram showing the construction of the NAND flash memory device shown in FIG. 1.

FIG. 1 is a block diagram of a NAND flash memory device. FIG. 2 is a detailed circuit diagram showing the construction of the NAND flash memory device shown in FIG. 1.

Referring to FIG. 1, the NAND flash memory device includes a NAND flash memory cell array, a buffer memory 200, a page buffer 300, a Y (column)-decoder 400, an output buffer 500 and an I/O pad 600. The NAND flash memory cell array consists of a plurality of blocks.

The construction of each of the constituting elements shown in FIG. 1 will be described in detail with reference to FIG. 2.

Referring to FIG. 2, one block 100 may include memory cells MC0 to MC15. These memory cells MC0 to MC15 are connected in series between a drain select transistor DST and a source select transistor SST to form cell strings. These cell strings are N in number. The drain select transistor DST is connected to each of bit lines BLo to BLn and the source select transistor SST is connected to a common source line CSL. The memory cell (e.g., M0) is controlled by one word line (e.g., WL0) and forms one page.

The buffer memory 200 may include special buffers SBM0 to SBM15 having the same structure as Static Random Access Memory (SRAM) and can include different memory cells. The buffer memory 200 also has the same size as that of the memory block 100 of the memory cell array.

These special buffers SBM0 to SBM15 are connected to the bit lines BLo to BLn, respectively and are located between the memory block 100 and the page buffer 200. Each of the special buffers (e.g., SBM0) is controlled by one sub-word line (e.g., SWL0).

Each of the special buffers SBM0 to SBM15 may include one latch circuit LT and two NMOS transistors N1, N2. The NMOS transistor N1 is turned on according to a special buffer reset signal (SBMRST) and sets a node QBb of a latch circuit LT to "0" and a node QB thereof to "1" during an erase operation. The NMOS transistor N2 sets the node QB of the latch circuit LT to "0" and the node QBb thereof to "1" during a program operation and transmits a signal of the node QB of the latch circuit LT to the page buffer 300 through a selected bit line during a read operation.

The page buffer 300 may be connected between the buffer memory 200 and the Y-decoder 400 and may include a bit line select & bias unit 310, a precharge unit 320 and a register 330. The bit lines BL0, BL1 are connected to the page buffer 300 through a sensing line SO. The page buffer 300 can be plural, but only two page buffers are shown in FIG. 2.

The bit line select & bias unit 310 includes bias supply transistors N11, N12 and bit line select transistors N13, N14. The bias supply transistor N11 has one end connected to the bit line BL0 and the other end connected to a line that supplies a bias signal (VIRPWR). The bias supply transistor N11 has the gate supplied with a gate control signal (DISCHe) and is thus turned on/off. The bias supply transistor N11 is turned on according to the gate control signal (DISCHe) and thus applies a power supply voltage (VCC) to the bit line BL0 as the bias signal (VIRPWR), if it is sought to program data into the bit line BL1. The bias supply transistor N12 has one end connected to the bit line BL1 and the other end connected to the line that provides the bias signal (VIRPWR). The bias supply transistor N12 has the gate supplied with a gate control signal (DISCHo) and is thus turned on/off. The bias supply transistor N12 is turned on according to the gate control signal (DISCHo) and thus applies the power supply voltage (VCC) to the bit line BL1 as the bias signal (VIRPWR), if it is sought to program data into the bit line BL0. The bit line select transistor N13 connects the bit line BL0 to the sensing line SO in response to a bit line select signal (BSLe). The bit line select transistors N14 connects the bit line BL1 to the sensing line SO in response to a bit line select signal (BSLo).

The precharge unit 320 includes a PMOS transistor P11, which is connected between the power supply voltage (VCC) and the sensing line SO and has the gate supplied with the precharge signal (PRECHb). The PMOS transistor P11 precharges the sensing line SO with the power supply voltage (VCC) during a read operation and supplies current to the bit line BL0 or BL1 through the sensing line SO.

The register 330 may include a latch circuit 331, NMOS transistors N21, N22 and N28, a reset transistor N23, data input transistors N24, N25, an inverter V13, a program transistor N26 and a read transistor N27.

The latch circuit 331 may include inverters V11, IV12 and latches data read from memory cells or data to be programmed.

The NMOS transistor N21 is turned on/off according to a signal of the sensing line SO. The NMOS transistor N22 is turned on/off according to a reset signal (RD) when reading data stored in the special buffer SBM of the buffer memory. The NMOS transistor N22 is turned on if the NMOS transistor N21 is turned on when the special buffer SBM of the buffer memory 200 is enabled, and sets the node QAb of the latch circuit 331 to "0" and the node QA thereof to "1". The NMOS transistor N28 is turned on when the NMOS transistor N21 is turned on during a read operation and sets the node QAb of the latch circuit 331 to "1" and the node QA thereof to "0".

The reset transistor N23 may include a NMOS transistor, which is connected between the node QA of the latch circuit 331 and a ground voltage (VSS) and has the gate supplied with a reset signal (PBRST). The reset transistor N23 sets the node QA of the latch circuit 331 to "0" and the node QAb thereof to "1" when reading data stored in the memory cell MC of the memory blocks 100.

The data input transistor N24 includes a NMOS transistor, which is connected between the node QAb of the latch circuit 331 and the column decoder 400 and has the gate supplied with a data input signal (DI). The data input transistor N25 includes a NMOS transistor, which is connected between the node QA of the latch circuit 331 and the column decoder 400 and has the gate supplied with a data input signal (nDI). The data input transistors N24, N25 are turned on according to the data input signals (DI, nDI), respectively, to store externally received data in the latch circuit 331.

The inverter V13 inverts the signal of the node QAb of the latch circuit 331.

The program transistor N26 may include a NMOS transistor, which is connected between the sensing line SO and an output terminal of the inverter V13 and has the gate supplied with a program signal (PGM). The program transistor N26 transmits program data, i.e., an output signal of the inverter V13 to a selected bit line BL0 or BL1 through the sensing line SO.

The read transistor N27 includes a NMOS transistor, which is connected between the output terminal of the inverter V13 and the column decoder 400 and has the gate supplied with a read signal (PBDO). The read transistor N27 transmits data output from the memory cells, i.e., an output signal of the inverter V13 to the output buffer 500 through the column decoder 400.

The column select unit 400 functions to transfer program data, which will be transmitted to the page buffer 300, or read data, which are read from the page buffer 300, to the output buffer 500.

FIG. 3 is a table showing a bias condition of the NAND flash memory device shown in FIG. 2.

The operation of the NAND flash memory device having the buffer memory will be described below with reference to FIGS. 2 and 3.

1. Erase Operation

If the special buffer SBM of the buffer memory is enabled, the memory blocks 100 and the buffer memory 200 perform the erase operation at the same time.

The memory block 100 applies a high voltage of 20V to a well region (TPWELL) of the memory cells MC0 to MC15 and applies 0V to the word lines WL0 to WL15, thus erasing data programmed into the memory cells MC0 to MC15 by way of Fowler-Nordheim (FN) tunneling.

The buffer memory 200 applies the power supply voltage (Vcc) to the special buffer reset signal (SBMRST) during a predetermined time to turn on the NMOS transistor N1, and sets the node QB of the latch circuit LT of the special buffers SBM0 to SBM15 to "1" and the node QBb thereof to "0". The buffer memory 200 also applies 0V to sub-word lines SWL0 to SWL15 to turn off the NMOS transistor N2.

A case where the special buffer SBM of the buffer memory is disabled will be described below.

In this case, only the memory block 100 performs the erase operation in the same manner as the above. However, 0V is applied to all the sub-word lines SWL0 to SWLn connected to the special buffer SBM and the special buffer reset signal (SBMRST) to turn off the NMOS transistors N1, N2.

2. Program Operation

A case where the special buffer SBM of the buffer memory is disabled will be first described.

The special buffers SBM0 to SBM15 of the buffer memory 200 performs a program operation so that the node QB of the latch circuit LT is set to "0" and the node QBb thereof is set to "1". The program operation is first performed in the special buffers SBM0 to SBM15 and is then carried out in the memory cells MC0 to MC15.

The program operation of the memory block 100 and the buffer memory 200 will be described below.

The NMOS transistor N25 is turned on according to the data input signal (nDL) and data "0" to be programmed are thus loaded onto the node QA of the latch circuit 331 within the page buffer 300. Thereafter, the PMOS transistor P11 is turned on according to the precharge signal (PRECH) to precharge the selected bit line (e.g., BL0) and the sensing node SO. The NMOS transistor N26 is then turned on according to the program signal (PGM) to apply 0V to a selected bit line BL0 or BL1. Vcc+Vth is applied to a selected sub-word line (e.g., SWL0) to turn on the NMOS transistor N2, so that the node QB of the latch circuit LT of the special buffer SBM0 is set to "0". The power supply voltage (VCC) is supplied to the non-selected bit line BL1 connected to the same sub-word line SWL0 through the bit line select & bias unit 310, prohibiting program (the special buffer SBM connected to non-selected bit lines maintain an erase state). In addition, 0V is applied to the special buffer reset signal (SBMRST) to turn off the NMOS transistor N1.

If the program operation of the buffer memory 200 is finished, the memory block 100 applies the program voltage (Vpgm) of 18V to a selected word line (e.g., WL0) and applies the program-prohibition voltage (Vpass) of 9.5V to non-selected word lines WL1 to WL15, thus programming data into a memory cell (e.g., MC0).

A case where the special buffer SBM of the buffer memory is disabled will be described below.

In this case, the program operation is performed only on selected memory cells of the memory blocks 100 under the program bias condition of FIG. 3, as described above. 0V is applied to the sub-word lines SWL of the buffer memory 200 and the special buffer reset signal (SBMRST) to turn off the NMOS transistors N1, N2.

3. Read Operation

A case where the special buffer SBM of the buffer memory is enabled will be described below.

In this case, data are not read from the memory block 100, but data are directly read from the buffer memory 200 in order to improve the read speed.

The PMOS transistor P11 is first turned on according to the precharge signal (PRECH) to precharge the sensing node SO to a level of Vcc. Vcc is then applied to the reset signal (RD) to turn on the NMOS transistors N21, N22, thus setting the node QAb of the latch circuit 331 to "0" and the node QA thereof to "1". Thereafter, the PMOS transistor P11 is turned off and the NMOS transistor N14 is turned off according to the bit line select signal (BSLe), connecting the bit line BL0 and the sensing node SO. Vcc+Vth is applied to a selected sub-word line (e.g., SWL0) to turn on the NMOS transistor N2 to transfer data of the node QB of the latch circuit LT (program data is "0" and erase data is "1") to a selected bit line BL0.

In the case of a program cell, since data of the node QB of the latch circuit LT of the special buffer SBM0 are "0", the NMOS transistor N21 is turned off to keep the node QAb of the latch circuit 331 to "0" and the node QA thereof to "1". In the case of an erase cell, since data of the node QB of the latch circuit LT of the special buffer SBM0 are "0", since data of the node QB of the latch circuit LT of the special buffer SBM0 are "1", the NMOS transistors N21, N28 are turned on, so that the node QAb of the latch circuit 331 is changed to "1" and the node QA thereof is changed to "0". Thereafter, the NMOS transistor N27 is turned on according to the data read signal (PBDO) to transfer the read data to the output buffer 500 through the Y-decoder 400.

A case where the special buffer SBM of the buffer memory is disabled will be described below.

Data are read from cells of the memory block 100. A common read operation will be then performed.

The NMOS transistor N23 is first turned on according to the reset signal (PBRST) to set the node QA of the latch circuit 331 to "0" and the node Qab thereof to "1". The PMOS transistor 11 is then turned on according to the precharge signal (PRECH) and the NMOS transistor N14 is turned on according to the bit line select signal (BSLe) to precharge the selected bit line BL0 and the sensing node SO. Thereafter, 0V is applied to the selected word line Vpgm and 4.5V is applied to a non-selected word line Vpass to read a state of a cell. The NMOS transistor N14 is turned on again according to the bit line select signal (BSLe) to transfer data of a cell to the page buffer 300. In the case of a programmed cell, the sensing node SO keeps precharged, so that the node QAb of the latch circuit 331 is changed to "0" and the node QA thereof is changed to "1". In the case of an erased cell, since the sensing node SO has been discharged, the node QAb of the latch circuit 331 is kept to "1" and the node QA thereof is kept to "0".

At this time, since the special buffer SBM of the buffer memory is not enabled, 0V is applied to all the sub-word lines SWL0 to SWL15 and the special buffer reset signal (SBMRST).

As described above, in the case where the special buffer SBM of the buffer memory is enabled, the read operation can be made fast by reading data, which are stored in the special buffers SBM0 to SBM15, into the page buffer 300. In the case where the special buffer SBM of the buffer memory is disabled, data stored in the memory cells MC0 to MC15 of the NAND flash memory device are normally read into the page buffer 300.

As described above, since the buffer memory is disposed in the NAND flash memory device, the read speed for a specific block can be improved.

Although the foregoing description has been made with reference to various embodiments, it is to be understood that changes and modifications may be made by the ordinary skilled in the art without departing from the spirit and scope of the present invention defined by appended claims.

What is claimed as new and desired to be protected by Letters Patent of the United States is:

1. A non-volatile memory device, comprising:
   a memory cell array including a plurality of memory blocks, each having memory cells disposed at the intersections of bit lines and word lines;
   a plurality of page buffers connected to the bit lines through a sensing line; and
   a buffer memory connected between the plurality of memory blocks and the plurality of page buffers,
   wherein the buffer memory includes special buffers for storing the same data as those of the memory cells.

2. The non-volatile memory device as claimed in claim 1, wherein the buffer memory has the same size as one block of the plurality of memory blocks.

3. The non-volatile memory device as claimed in claim 1, wherein the special buffers have the same number as that of the memory cells.

4. The non-volatile memory device as claimed in claim 1, wherein the special buffers have the same structure as that of a SRAM.

5. The non-volatile memory device as claimed in claim 1, wherein during a read operation, data stored in the special buffers are read into the plurality of page buffers.

6. The non-volatile memory device as claimed in claim 1, wherein during a program operation, the same data are programmed into each of the memory cells and the special buffers.

7. The non-volatile memory device as claimed in claim 1, wherein each of the special buffers comprises:
   a latch circuit that stores data;
   a first transistor that sets a first node of the latch circuit to logic low and a second node thereof to logic high during an erase operation; and
   a second transistor that sets the first node of the latch circuit to logic high and the second node thereof to logic low during a program operation.

8. The non-volatile memory device as claimed in claim 1, wherein if data stored in the special buffers are program data when reading data stored in the special buffers, the sensing line becomes logic low, and if data stored in the special buffers are program data when reading data stored in the special buffers, the sensing line becomes logic high.

9. The non-volatile memory device as claimed in claim 1, wherein if data stored in the memory cells are program data when reading data stored in the memory cells, the sensing line becomes logic high, and if data stored in the memory cells are program data when reading data stored in the memory cells, the sensing line becomes logic low.

10. The non-volatile memory device as claimed in claim 1, wherein each of the plurality of page buffers comprises:
   a latch circuit that stores data;
   a precharge unit that precharges the sensing node;
   a data input unit that stores program data in the latch circuit;
   a first transistor that transmits a ground voltage in response to a signal of the sensing line;
   a second transistor that sets a first node of the latch circuit to logic low and a second node thereof to logic high while operating in conjunction with the first transistor, when reading data stored in the special buffers;
   a third transistor that sets the first node of the latch circuit to logic high and the second node thereof to logic low when reading data stored in the special buffers;
   a fourth transistor that changes data of the first and second nodes of the latch circuit while operating in conjunction with the first transistor, when reading data stored in the special buffers or data stored in the memory cells;
   an inverting element that inverts data of the first node of the latch circuit;
   a fifth transistor that transmits data, which are output from the inverting element, to a selected bit line through the sensing line; and
   a sixth transistor that transmits data, which are output from the inverting element, to a data line.

* * * * *